United States Patent
Arimoto

(10) Patent No.: US 7,653,106 B2
(45) Date of Patent: Jan. 26, 2010

(54) SEMICONDUCTOR LASER APPARATUS AND OPTICAL AMPLIFIER APPARATUS

(75) Inventor: Hideo Arimoto, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 125 days.

(21) Appl. No.: 12/003,208

(22) Filed: Dec. 20, 2007

(65) Prior Publication Data

US 2008/0198888 A1    Aug. 21, 2008

(30) Foreign Application Priority Data

Feb. 16, 2007   (JP) ............................. 2007-035622

(51) Int. Cl.
*H01S 5/00* (2006.01)
*G02B 6/42* (2006.01)

(52) U.S. Cl. .................................. 372/46.011; 385/30
(58) Field of Classification Search ............ 372/46.011; 385/30
See application file for complete search history.

(56) References Cited

U.S. PATENT DOCUMENTS

| | | | | |
|---|---|---|---|---|
| 6,052,398 | A * | 4/2000 | Brillouet et al. | 372/46.01 |
| 6,724,013 | B2 * | 4/2004 | Kneissl et al. | 257/79 |
| 7,257,283 | B1 * | 8/2007 | Liu et al. | 385/14 |
| 2004/0013146 | A1 * | 1/2004 | Ungar | 372/45 |
| 2004/0179568 | A1 * | 9/2004 | Amann et al. | 372/45 |
| 2006/0126687 | A1 * | 6/2006 | Amann | 372/43.01 |
| 2008/0002929 | A1 * | 1/2008 | Bowers et al. | 385/15 |

OTHER PUBLICATIONS

Fang et al., "Electrically Pumped Hybrid AlGaInAs-Silicon Evanescent Laser", 2006, OSA, Optics Express, vol. 14, No. 20, 9203-9209.*
H. Rong et al., "a Continuous-Wave Raman Silicon Laser", Nature, vol. 433, Feb. 17, 2005, pp. 725-728.

* cited by examiner

*Primary Examiner*—Minsun Harvey
*Assistant Examiner*—Joshua King
(74) *Attorney, Agent, or Firm*—Stites & Harbison PLLC; Juan Carlos A. Marquez, Esq.

(57) ABSTRACT

A method of bonding a compound semiconductor on a silicon waveguide is used for attaining a laser above a silicon substrate. While it is essential to attain laser oscillation by injection of a current, since amorphous is formed at the bonding surface of a silicon compound semiconductor, it is difficult to directly inject the current through the silicon waveguide to the compound semiconductor. Further, even when an electrode is formed near the waveguide and the current is injected, since the current is not injected near the silicon waveguide, laser oscillation through the silicon waveguide can not be attained. The problem is solved by forming a structure of laterally injecting a current to the silicon waveguide and concentrating the current near the silicon waveguide in a compound semiconductor. Specific methods includes the following two methods, that is, a method of forming a tunneling junction structure in the compound semiconductor and another method of laterally forming a P-I-N junction to the compound semiconductor.

10 Claims, 14 Drawing Sheets

SEMICONDUCTOR LASER APPARATUS AND OPTICAL AMPLIFIER APPARATUS

CLAIM OF PRIORITY

The present application claims priority from Japanese Application JP 2007-035622 filed on Feb. 16, 2007, the content of which is hereby incorporated by reference into this application.

FIELD OF THE INVENTION

The present invention concerns a semiconductor laser apparatus and an optical amplifier apparatus and, more in particular, it relates to parts for amplifying light for use in semiconductor lasers, optical amplifiers, etc. More specifically, it relates to optical parts decreased in the size and the cost in which optical parts and electronic parts are integrated on a silicon substrate, as well as it relates to a technique capable of optical amplification by current injection.

BACKGROUND OF THE INVENTION

In recent years, along with rapid popularization of communication infrastructures and outstanding increase in the performance of information processing such as of computers, it has been demanded to increase the operation speed, as well as decrease the size and the cost for optical transmission and receiving equipments or optical switches. Under the background described above, development has been conducted vigorously for silicon photonics that realize optical parts by using silicon materials instead of compound semiconductors typically represented by GaAs and InP used so far.

For optical parts such as optical waveguides and optical synthesizers/branchers, operation in the use of the silicon material has already been confirmed. However, since silicon is an indirect transition type semiconductor, it is difficult to amplify light. While Intel Co. in USA has announced a silicon laser having a Raman effect (Nature 433, 725-728 (2004)), it involves a problem that incidence of a laser light from the outside is necessary.

SUMMARY OF THE INVENTION

As has been described above, it is difficult for the silicon material to amplify light in the inside thereof. In view of the above, it is considered for the optical parts to manufacture passive parts such as optical waveguides and optical synthesizers/branchers with silicon and manufacture those parts requiring optical amplification such as lasers or optical amplifiers with compound semiconductors.

The University of California, Santa Barbara has reported layer oscillation in which a compound semiconductor is bonded on a silicon waveguide. The operation principle is that an optical mode overlaps on both silicon and compound semiconductor, in which a most portion thereof is guided in silicon but a portion thereof is guided in the compound semiconductor where light is amplified to conduct laser oscillation (Optics Express, Vol. 13 Issue 23, pp. 9460-9464. However, laser oscillation is conducted by excitation with an external light and it is not practical to apply the same to actual devices.

For application to actual devices, it is essential to attain laser oscillation by current injection. However, when a compound semiconductor is bonded on a silicon waveguide, amorphous is formed to the bonded surface. Since the amorphous is generally an insulator, it is difficult to inject a current directly through the silicon waveguide to the compound semiconductor. Further, even in a case where an electrode is formed near the waveguide and the current is injected, since the current is not injected to the vicinity of the silicon waveguide, laser oscillation through the silicon waveguide is not attained.

In view of the above, two methods of injecting current from the lateral direction of a silicon waveguide have been considered.

(1) According to the first method, a compound semiconductor substrate is provided with a tunneling junction structure. A compound semiconductor member including a first conduction type first semiconductor layer, a semiconductor active layer, and a second conduction type second semiconductor layer formed in this order above a compound semiconductor substrate, and a tunneling junction structure having a second conduction type third semiconductor layer formed in a stripe pattern to a portion above the semiconductor substrate and doped at a concentration higher than that of the second semiconductor layer, a first conduction type fourth semiconductor layer formed in a stripe pattern to a portion above the substrate, and a first conduction type fifth semiconductor layer doped at a concentration lower than that of the fourth semiconductor layer, and having a first electrode to a portion of a surface nearer to the tunneling junction structure and a second electrode to at least a portion of the surface remote from the tunneling junction structure, for both surfaces of the substrate is manufactured and provided.

Further, a silicon member provided with a silicon waveguide formed by fabricating a silicon layer in a rectangular shape above an SOI substrate formed with the silicon by way of a buried oxide layer above silicon and a third electrode disposed to a portion thereof for injecting a current into the semiconductor active layer is manufactured and provided.

The compound semiconductor member is bonded above the silicon member in the extending direction of the silicon waveguide and in the extending direction of the tunneling junction above the silicon waveguide, such that the tunneling junction situates in parallel. Thus, the semiconductor laser waveguide is completed. Then, the first electrode and the third electrode are in contact with the n-type semiconductor layer 14 of the compound semiconductor 10.

Current is injected by using the structure from the second electrode to the first electrode and from the second electrode to the third electrode. Thus, the current is concentrated to a portion of the compound semiconductor near the silicon waveguide to enable laser oscillation or optical amplification through the silicon waveguide.

(2) According to the second method, a lateral P-I-N junction is formed to a compound semiconductor substrate. A compound semiconductor member having, above a compound semiconductor substrate, a waveguide type semiconductor active layer formed in a stripe pattern to a portion on the substrate, a first conduction type first contact layer on the first side and a second conduction type second contact layer on the second side with respect to the waveguide type semiconductor active layer being as a center, and having a first electrode on the first contact layer and the second electrode on the second contact layer is manufactured. Further, above an SOI substrate formed with a silicon layer by way of a buried oxide layer on a silicon substrate, a silicon member having a silicon waveguide formed by fabricating the silicon layer into a rectangular shape, and a first conduction type third electrode and a second conduction type fourth electrode is manufactured. The compound semiconductor member is bonded to the silicon member such that the semiconductor active layer situates in parallel above the silicon waveguide to form a semiconductor laser waveguide thereby preparing a structure of contacting, the first electrode with the third electrode and contacting the second electrode with the fourth electrode. In a case of injecting a current by using the structure from the third electrode to the fourth electrode, the current is concentrated to the compound semiconductor portion near the silicon waveguide to attain laser oscillation or light amplification through the silicon waveguide.

Recently, the University of California, Santa Barbara and Intel Co. in USA have reported a structure of confining a current by injection of protons and lateral injection of current to conduct laser oscillation by current injection (Optics Express, Vol. 14, Issue 20, pp. 9203-9410). However, there may be a possibility that reliability for a long time may be degraded by injection of the protons near the semiconductor active layer. In the invention, since protons are not injected near the semiconductor active layer, high reliability for a long time can be expected.

Outline of preferred embodiments according to the invention is as described below.

1. A semiconductor laser apparatus including:
   a compound semiconductor member; in which
   a first conduction type first clad layer, an active layer, and a second conduction type second clad layer are disposed in this order above a compound semiconductor substrate,
   a second conduction type first semiconductor layer doped with an impurity at a concentration higher than that of the second clad layer and a first conduction type second semiconductor layer are disposed to a portion on the second clad layer, the first semiconductor layer and the second semiconductor layer are overlapped and each in a stripe shape,
   a first conduction type third semiconductor layer doped at a concentration lower than that of the second semiconductor layer is disposed, the third semiconductor layer surrounds the first and the second semiconductor layers and is disposed on the second clad layer,
   the first and the second semiconductor layers confine the current, and the portion of the first to third semiconductor layers constitutes a tunneling junction structure,
   a first electrode is disposed on the compound semiconductor substrate on the side opposite to the first clad layer of the compound semiconductor substrate, and
   the second and third electrodes are disposed on the third semiconductor layer and at positions spaced from the portion of the tunneling junction structure,
   a silicon optical waveguide in a stripe shape formed on an SOI (Silicon-On-Insulator) substrate in which a silicon layer is disposed by way of a buried oxide layer above a silicon member, and
   a silicon member in which fourth and fifth electrodes are spaced apart from each other for supplying a current to the active layer while being fixed to the second and third electrodes respectively, in which
   the second electrode and the fourth electrode are fixed and the third electrode and the fifth electrode are fixed and, in a case where they are fixed, at least a portion of the silicon optical waveguide and the third semiconductor layer are in contact with each other.

2. A semiconductor laser apparatus according to 1 described above, wherein the apparatus is formed as a distributed feedback type by the provision of a diffraction grating near the active layer.

3. A semiconductor laser apparatus according to 1 described above, wherein
   the silicon optical waveguide extends to both outsides of a portion where silicon optical waveguide and the third semiconductor layer are in contact respectively to form a first silicon optical waveguide and a second silicon optical waveguide,
   a first ring-shape resonator is disposed near the first silicon optical waveguide and on the silicon member, a third silicon optical waveguide is disposed near the first ring-shape resonator and on the silicon member, and a first conduction type reflection mirror is disposed to a portion of the third silicon optical waveguide, and
   a second ring-shape resonator is disposed near the second silicon optical waveguide and on the silicon member, a fourth optical waveguide is disposed near the second ring-shape resonator and on the silicon member, and a second conduction type reflection mirror is disposed to a portion of the fourth silicon optical waveguide.

4. A semiconductor laser apparatus according to 3 described above, single mode oscillation is conducted at a wavelength λ1 where the reflectance peaks of the first and the second ring-shape resonators are aligned.

5. A semiconductor laser apparatus according to 1 described above, wherein the end of the silicon optical waveguide and the end of the third semiconductor layer constitute first and second reflection mirrors, respectively.

6. An optical amplifier apparatus including:
   a compound semiconductor member; in which
   a first conduction type first clad layer, an active layer, and a second conduction type second clad layer are disposed in this order above a compound semiconductor substrate,
   a second conduction type first semiconductor layer doped with an impurity at a concentration higher than that of the second clad layer and a first conduction type second semiconductor layer are disposed to a portion on the second clad layer, the first semiconductor layer and the second semiconductor layer are overlapped and each in a stripe shape,
   a first conduction type third semiconductor layer doped at a concentration lower than that of the second semiconductor layer is disposed, the third semiconductor layer surrounds the first and the second semiconductor layers and is disposed on the second clad layer,
   the first and the second semiconductor layers confine the current, and the portion of the first to third semiconductor layers constitutes a tunneling junction structure,
   a first electrode is disposed on the compound semiconductor substrate on the side opposite to the first clad layer of the compound semiconductor substrate, and
   the second and third electrodes are disposed on the third semiconductor layer and at positions spaced from the portion of the tunneling junction structure,
   a silicon optical waveguide in a stripe shape formed on an SOI (Silicon-On-Insulator) substrate in which a silicon layer is disposed by way of a buried oxide layer above a silicon member, and
   a silicon member in which fourth and fifth electrodes are spaced apart from each other for supplying a current to the active layer while being fixed to the second and third electrodes respectively, in which
   the second electrode and the fourth electrode are fixed and the third electrode and the fifth electrode are fixed and, in a case where they are fixed, at least a portion of the silicon optical waveguide and the third semiconductor layer are in contact with each other.

7. An optical amplifier apparatus according to 6 described above, wherein, the apparatus is formed as a distributed feedback type by the provision of a diffraction grating near the active layer.

8. An optical amplifier apparatus according to 6 described above, wherein, the silicon optical waveguide extends to both outsides of a portion where silicon optical waveguide and the third semiconductor layer are in contact respectively to form a first silicon optical waveguide and a second silicon optical waveguide, a first ring-shape resonator is disposed near the first silicon optical waveguide and on the silicon member, a third silicon optical waveguide is disposed near the first ring-shape resonator and on the silicon member, and a first conduction type reflection mirror is disposed to a portion of the third silicon optical waveguide, and a second ring-shape resonator is disposed near the second silicon optical waveguide and on the silicon member, a fourth optical waveguide is disposed near the second ring-shape resonator and on the silicon member, and a second conduction type reflection mirror is disposed to a portion of the fourth silicon optical waveguide.

9. An optical amplifier apparatus according to 8 described above, wherein, single mode oscillation is conducted at a wavelength λ1 where the reflectance peaks of the first and the second ring-shape resonators are aligned.

10. An optical amplifier apparatus according to 6 described above, wherein the end of the silicon optical waveguide and the end of the third semiconductor layer constitute first and second non-reflection mirrors respectively.

11. A semiconductor laser apparatus including;

a compound semiconductor member in which a waveguide type semiconductor active layer is disposed to a portion on a first insulating semiconductor layer disposed above a compound semiconductor substrate, a second insulating semiconductor layer is disposed on the active layer for confining a current to the active layer, the active layer and the second insulating semiconductor layer are overlapped and each in a stripe shape, a first waveguide type first contact layer is disposed on one side of a stack having the active layer and the second insulating semiconductor layer, and a second waveguide type second contact layer is disposed on the other side of the stack, and a first electrode is disposed on the first contact layer and a second electrode is disposed on the second contact layer, a first silicon optical waveguide in a stripe shape formed on an SOI (Silicon-On-Insulator) substrate provided with a silicon layer by way of a buried oxide layer on the silicon member, and a silicon member in which third and fourth electrodes are spaced apart from each other for supplying a current to the active layer while being fixed to the first and second electrodes respectively, in which the first electrode and the third electrode are fixed, the second electrode and the fourth electrode are fixed and, in a case where they are the fixed, at least a portion of the first silicon optical waveguide and the second insulating semiconductor layer are in contact with each other.

12. A semiconductor laser apparatus according to 11 described above, wherein the apparatus is formed as a distributed feedback type by the provision of a diffraction grating near the active layer.

13. A semiconductor laser apparatus according to 11 described above, wherein the first silicon optical waveguide in contact with the second insulating semiconductor layer and the second silicon waveguide are connected, and the second silicon optical waveguide is disposed on the silicon member.

14. A semiconductor laser apparatus according to 11 described above, wherein the end of the first silicon optical waveguide and the end of the second silicon optical waveguide constitute first and second reflection mirrors respectively.

According to the invention, laser oscillation or optical amplification can be attained by guiding a light through a silicon waveguide on an SOI substrate and injection of current to a tunneling junction structure of a compound semiconductor member.

DETAILED DESCRIPTION OF THE PREFERRED EMBODIMENT

Preferred embodiments of the invention are to be described specifically with reference to the drawings.

First Embodiment

Figure 1A:
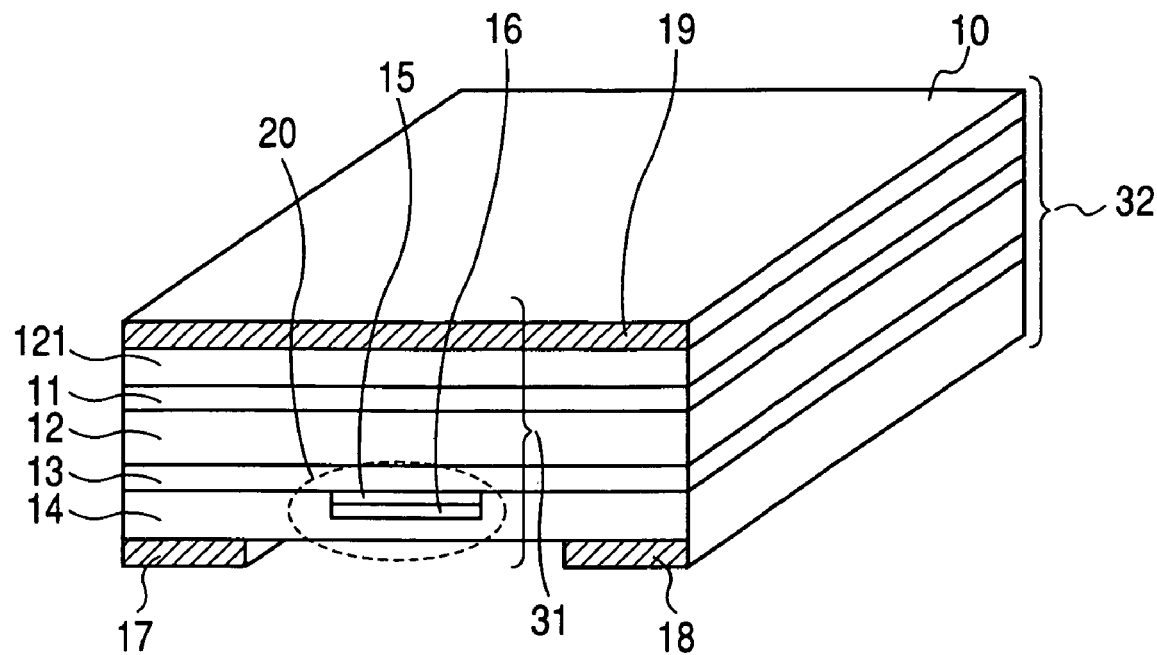
FIG. 1A shows a semiconductor laser shown in a first embodiment of the invention.
Figure 1B:
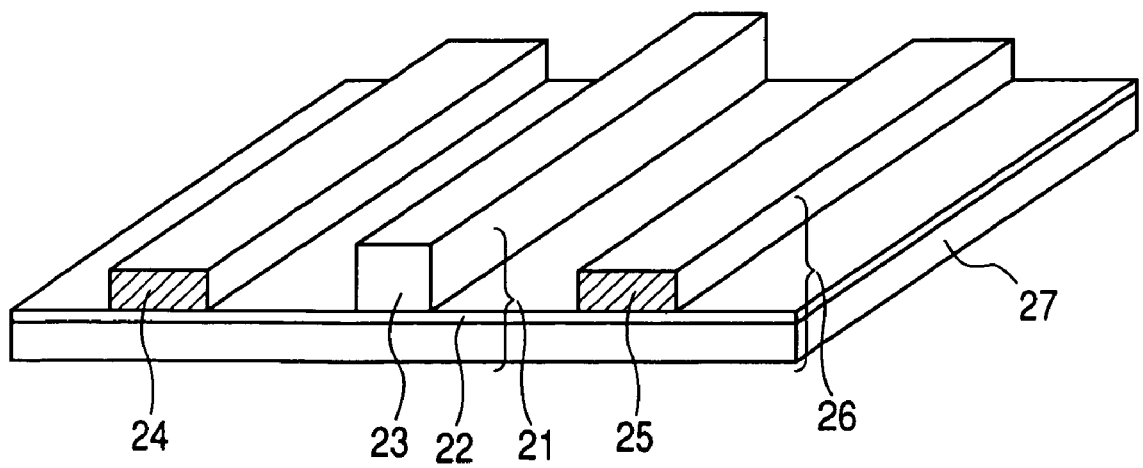
FIG. 1B shows a semiconductor laser shown in the first embodiment of the invention.

FIGS. 1A and 1B show a first embodiment of the invention. This embodiment is an example of forming a laser resonator between end faces 31 and 32 to attain laser oscillation. FIG. 1A is a perspective view of a compound semiconductor, FIG.

Figure 1C:
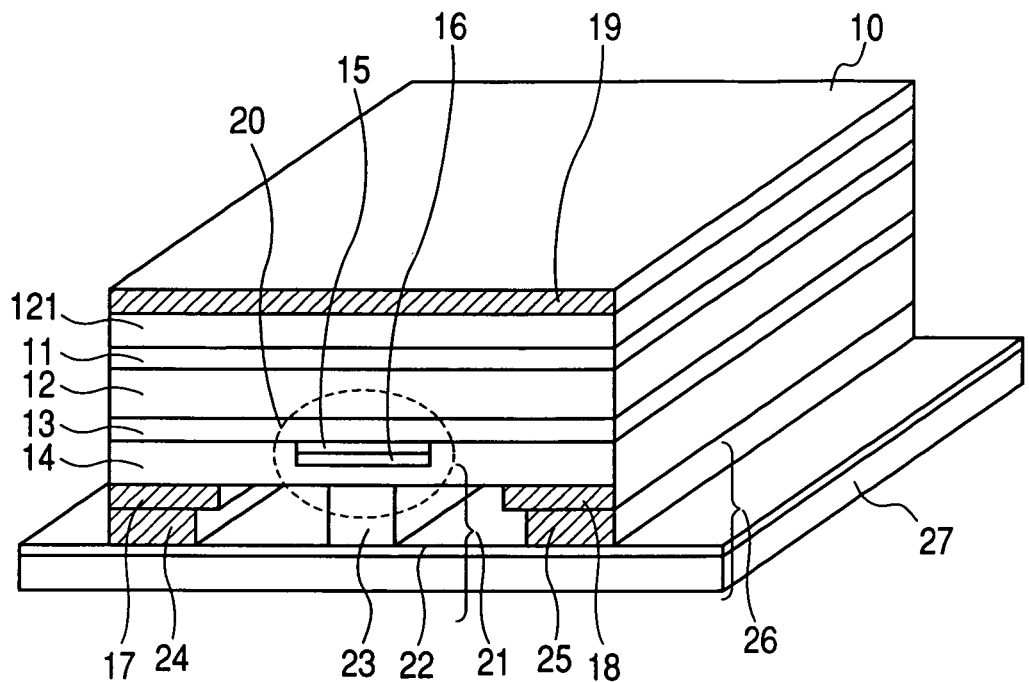
FIG. 1C shows a semiconductor laser shown in the first embodiment of the invention.
Figure 1D:
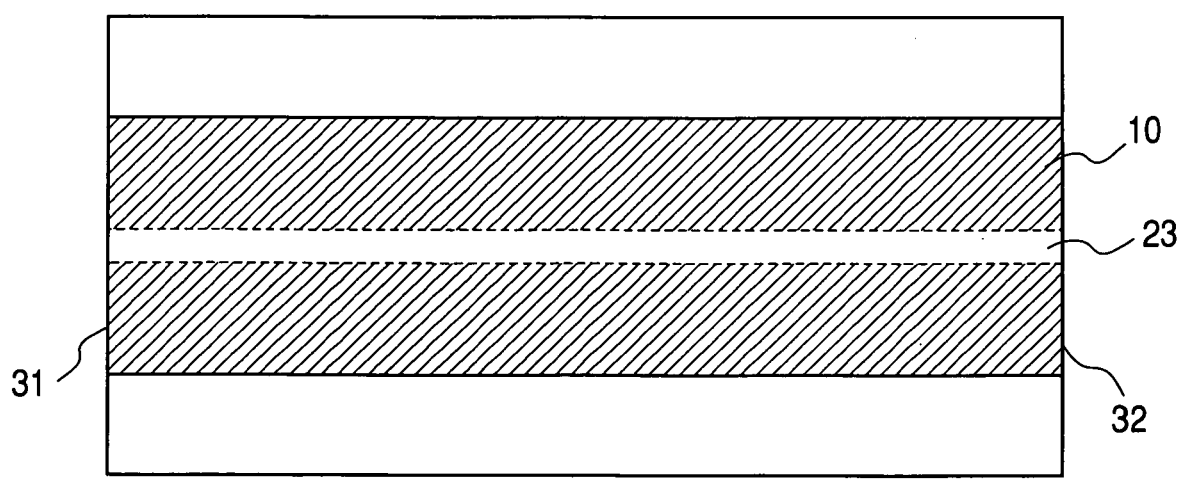
FIG. 1D shows a semiconductor laser shown in the first embodiment of the invention.
Figure 7:
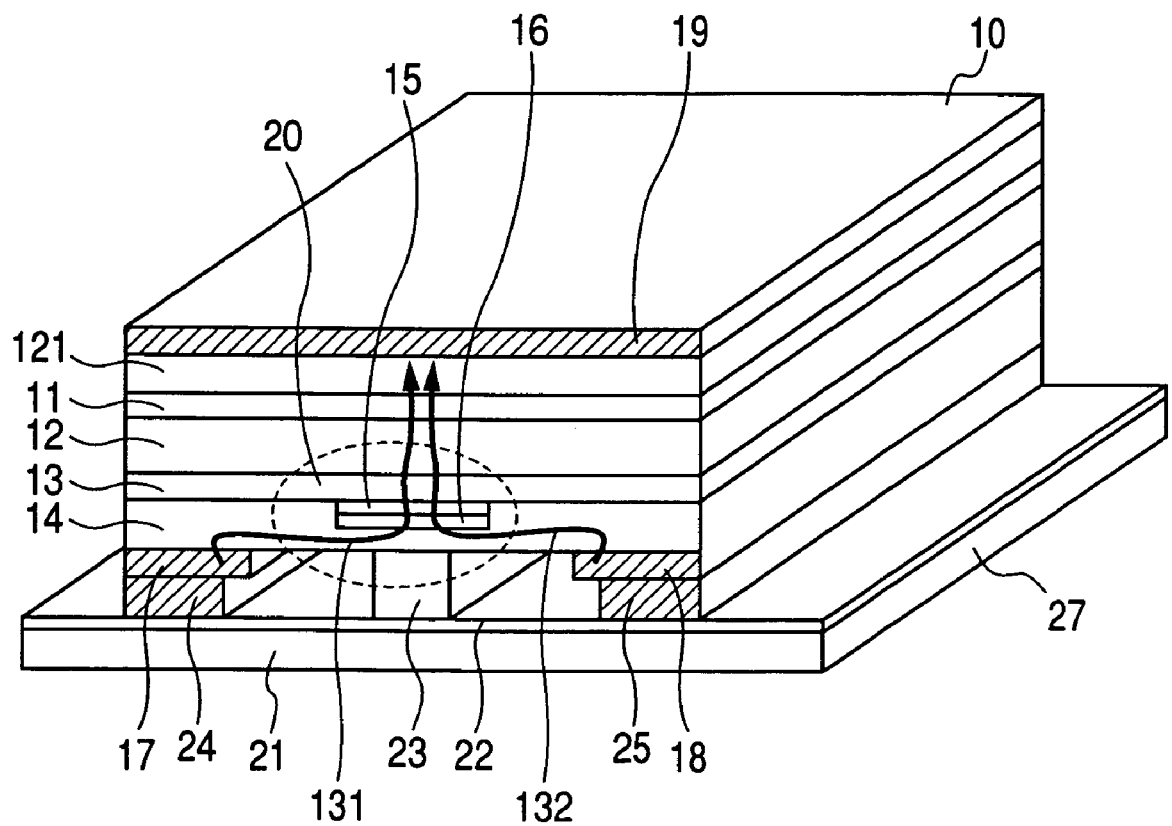
FIG. 7 is a view for assisting the explanation of the semiconductor laser shown in the first embodiment of the invention.

1B is a perspective view of an SOI (Silicon-On-Insulator) substrate, FIG. 1C is an entire perspective view, and FIG. 1D is an entire upper plan view. FIG. 7 is a view showing a current injection path in the entire upper plan view.

As shown in FIG. 1A, on a compound semiconductor substrate 121 using InP as a material, an n-type semiconductor layer 11 (for example, a first clad layer here and hereinafter), a semiconductor active layer 12, and a p-type semiconductor layer 13 (for example, a second clad layer here and hereinafter) are disposed. Further, a tunneling junction structure 20, a p-type semiconductor layer 15 doped at a concentration higher than that of the p-type semiconductor layer 13, an n-type semiconductor layer 16, and an n-type semiconductor layer 14 doped at a concentration lower than that of the n-type semiconductor layer 15 is disposed above the p-type semiconductor layer 13.

The p-type semiconductor layer 15 and the n-type semiconductor layer 16 are in a stripe shape, the n-type semiconductor layer 14 surrounds the p-type semiconductor layer 15 and the n-type semiconductor layer 16 and is disposed on the p-type semiconductor layer 13.

As shown in the drawing, first electrodes 17 and 18 are disposed partially on the n-type semiconductor layer 14. As shown in the drawing, a second electrode is 19 disposed to at least a portion of the surface to the compound semiconductor substrate 121 on the side opposite to the n-type semiconductor layer 11.

They are entirely referred to as a compound semiconductor member 10.

As shown in FIG. 1B, an SOI substrate 21 has a silicon waveguide 23 formed by fabricating a silicon layer each into a rectangular shape and third electrodes 24, 25 for injecting current into the semiconductor active layer 12. They are entirely referred to as a silicon member 26.

As shown in FIG. 1C, the compound semiconductor member 10 is bonded above the silicon member 26 such that the extending direction of the silicon waveguide 23 situates in parallel with the extending direction of the tunneling junction 20 in the compound semiconductor member 10. Thus a semiconductor laser apparatus is formed. The silicon waveguide 23 and the semiconductor layer 14 are bonded by cleaning the junction surface with plasmas in vacuum. Simultaneously, the electrode 17 and the electrode 24, and the electrode 18 and the electrode 25 are brought into contact and connected, thereby enabling current injection.

As a result, as shown in FIG. 7, current is injected from the electrodes 24 and 25 through the n-type semiconductor layer 14, and the tunneling junction 20 to the electrode 19. Since the current injected in this case to the semiconductor active layer 12 does not pass the boundary between the silicon 23 and the compound semiconductor 14, the current can be injected in a state of low resistance. Further, since the tunneling junction is formed, current is concentrated near the silicon waveguide 23 where the optical mode is concentrated to amplify the light efficiently.

Finally, as shown in FIG. 1D, both end faces of the compound semiconductor member 10 and the silicon member 26 are cleaved to form reflection mirrors 31, 32, to form a Fabry-Perot semiconductor laser apparatus.

The laser apparatus of this embodiment conducts multi-mode oscillation at a threshold value of 20 mA by current injection.

Further, by forming a non-reflection film to the reflection mirrors 31, 32, an optical amplifier apparatus can be obtained instead of the semiconductor laser apparatus. The optical amplifier amplifies only at 15 dB by injection of current at 300 mA.

While the compound semiconductor material is formed of InP in this embodiment, it may be also formed of GaAs.

Second Embodiment

Figure 8:
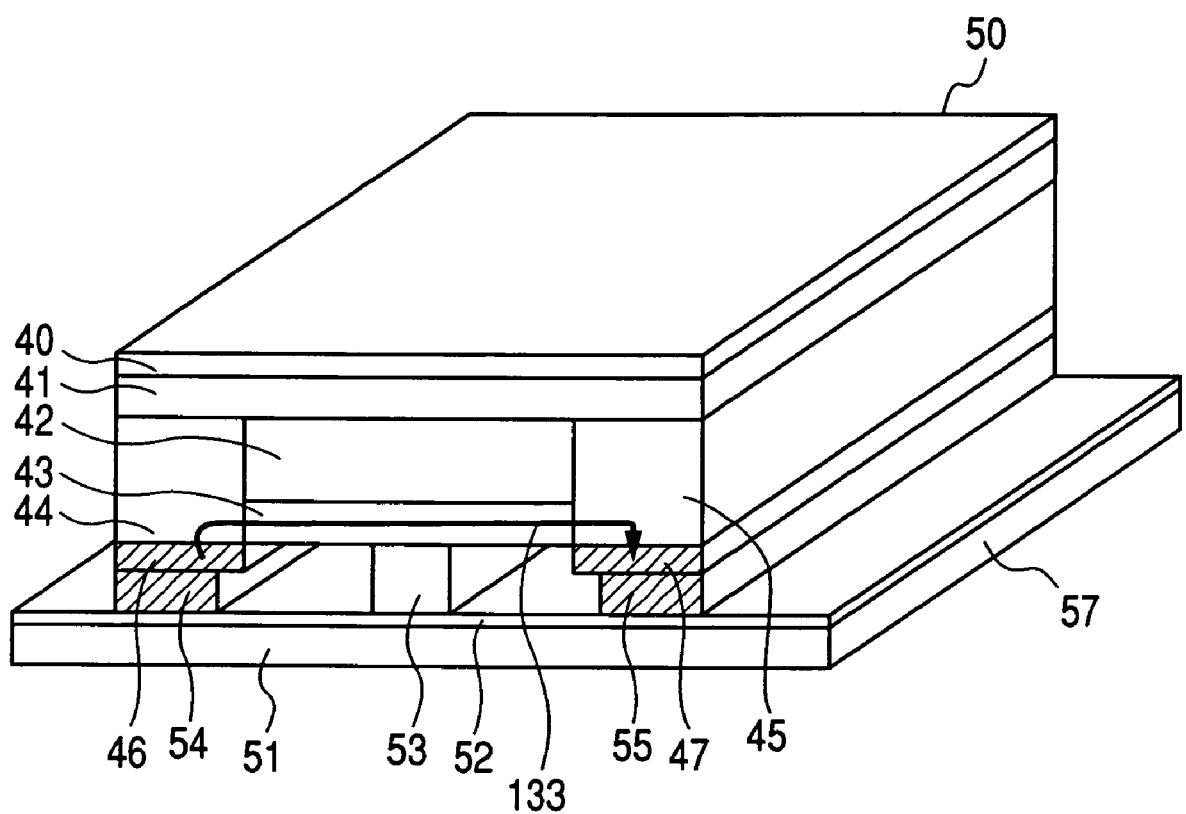
FIG. 8 is a view for assisting the explanation of the semiconductor laser shown in the second embodiment of the invention.

FIG. 2 shows a second embodiment of the invention. This embodiment is an example of forming a laser resonator between end faces 61, 62 to attain laser oscillation. FIG. 2A is a perspective view of a compound semiconductor, FIG. 2B is a perspective view of an SOI (Silicon-On-Insulator) substrate, FIG. 2C is a perspective view for a compound semiconductor member and an SOI substrate in combination, for example, an entire semiconductor laser apparatus, and FIG. 2D is an entire upper plan view thereof. FIG. 8 is a view showing a current injection path in the entire perspective view.

Figure 2A:
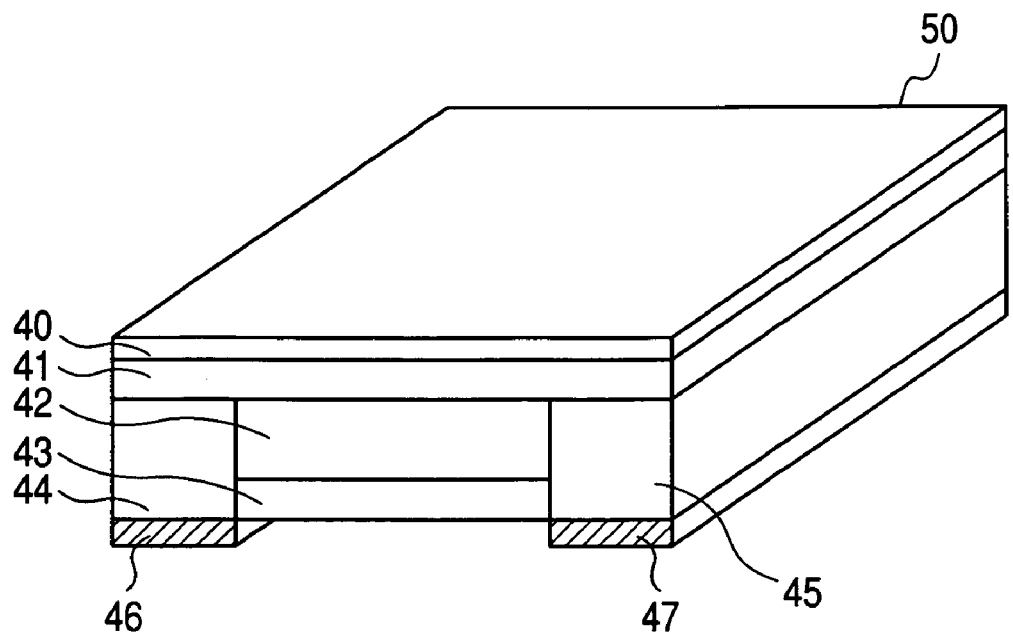
FIG. 2A shows a semiconductor laser shown in a second embodiment of the invention.

As shown in FIG. 2A, the compound semiconductor has a semiconductor active layer 42 formed in a stripe shape to a portion on an insulative semiconductor layer 41 above a compound semiconductor substrate 40 made of InP, an insulative semiconductor layer 43 for confining a current to the active layer, an n-doped contact layer 44, and a p-type doped contact layer 45, in which an electrode 46 is disposed on the contact layer 44 and an electrode 47 is disposed on the contact layer 45. They are referred to as a compound semiconductor member 50.

Figure 2B:
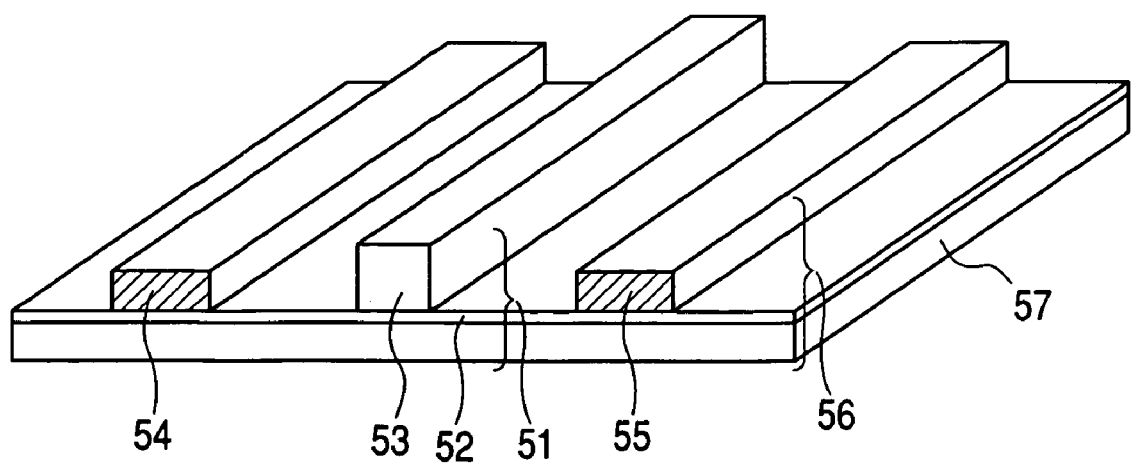
FIG. 2B shows a semiconductor laser shown in the second embodiment of the invention.

As shown in FIG. 2B, an SOI substrate 51 in which a silicon layer is formed by way of a buried oxide layer 52 above a silicon substrate has a silicon waveguide 53 and electrodes 54, 55 formed by fabricating a silicon layer 57 each into a rectangular shape. They are referred to as a silicon member 56.

Figure 2C:
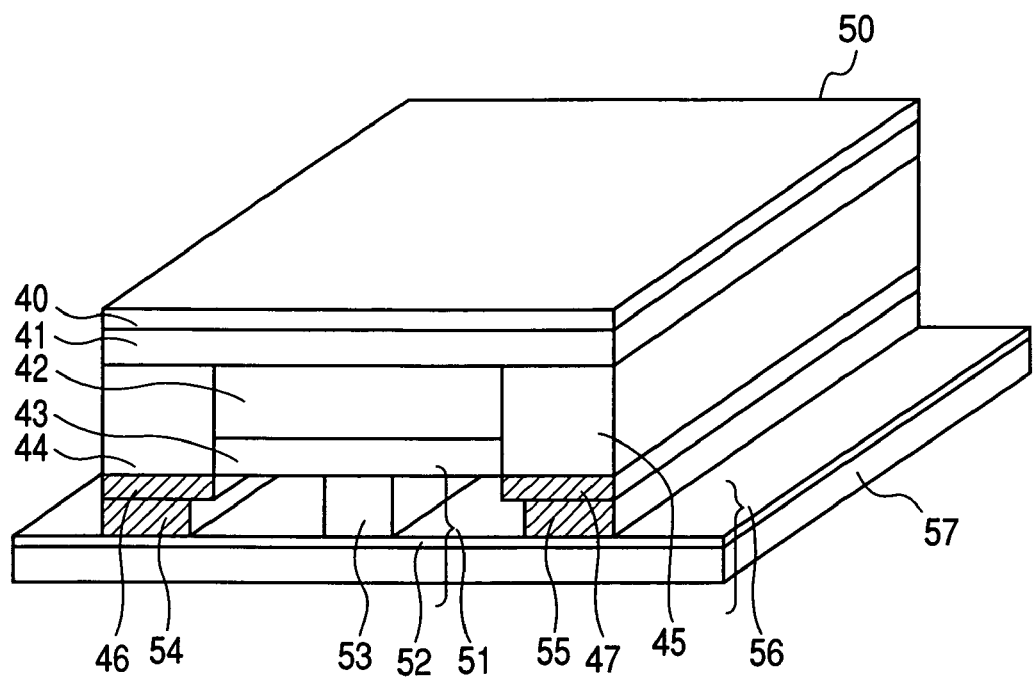
FIG. 2C shows a semiconductor laser shown in the second embodiment of the invention.
Figure 2D:
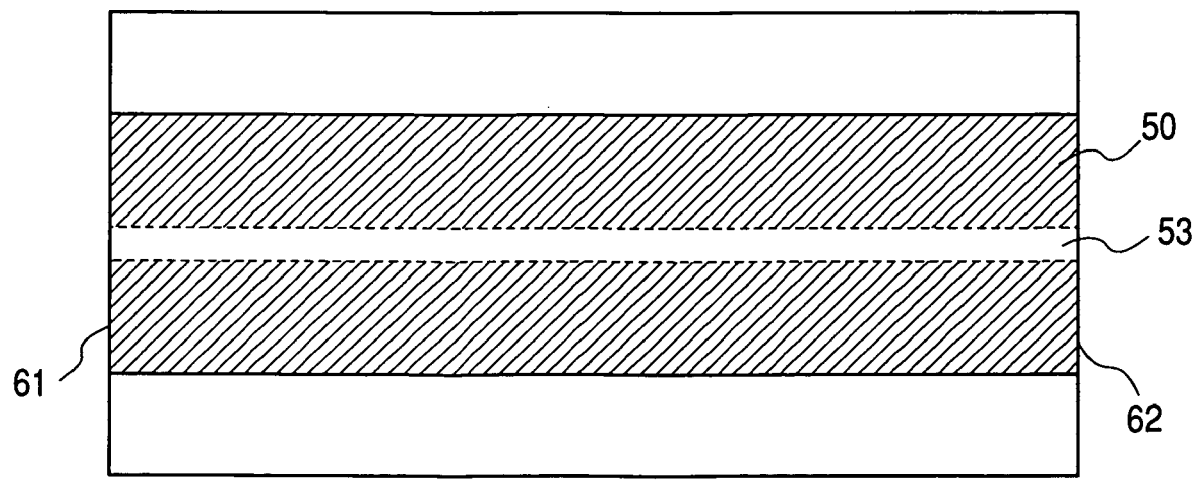
FIG. 2D shows a semiconductor laser shown in the second embodiment of the invention.

As shown in FIG. 2C, the compound semiconductor member 50 is bonded above the silicon member 56 such that the extending direction of the silicon waveguide 53 and the extending direction of the semiconductor active layer 42 above the semiconductor substrate situate in parallel. Thus, a semiconductor laser waveguide is formed.

The silicon waveguide 53 and the semiconductor layer 43 are preferably cleaned for the bonded surface by plasmas in vacuum and then bonded. Simultaneously, the electrode 47 and the electrode 54, and the electrode 48 and the electrode 55 are connected.

In this case, since the current injected into the semiconductor active layer does not pass through the boundary between the silicon and the compound semiconductor, current can be injected at a state of low resistance. Further, current is concentrated near the silicon waveguide 53 where the optical mode is concentrated and light is amplified efficiently.

Finally, when both end faces of the compound semiconductor member 50 and the silicon member 56 are cleaved to form reflection mirrors 61, 62, as shown in FIG. 11 Fabry-Perot laser is obtained.

This laser conducts multi-mode oscillation at a threshold value of 20 mA by current injection.

Further, by forming a non-reflection film to the reflection mirrors 61, 62, an optical amplifier apparatus can be formed instead of the semiconductor laser apparatus. The optical amplifier apparatus amplified only by 15 dB by the injection of a current at 300 mA.

While InP was used as the material for the compound semiconductor in this embodiment it may also be GaAs.

Third Embodiment

FIG. 3 shows a third embodiment of the invention. In this embodiment, a distributed feedback type laser is formed by additionally forming a diffraction grating to the compound semiconductor member described in the first embodiment.

Figure 3A:
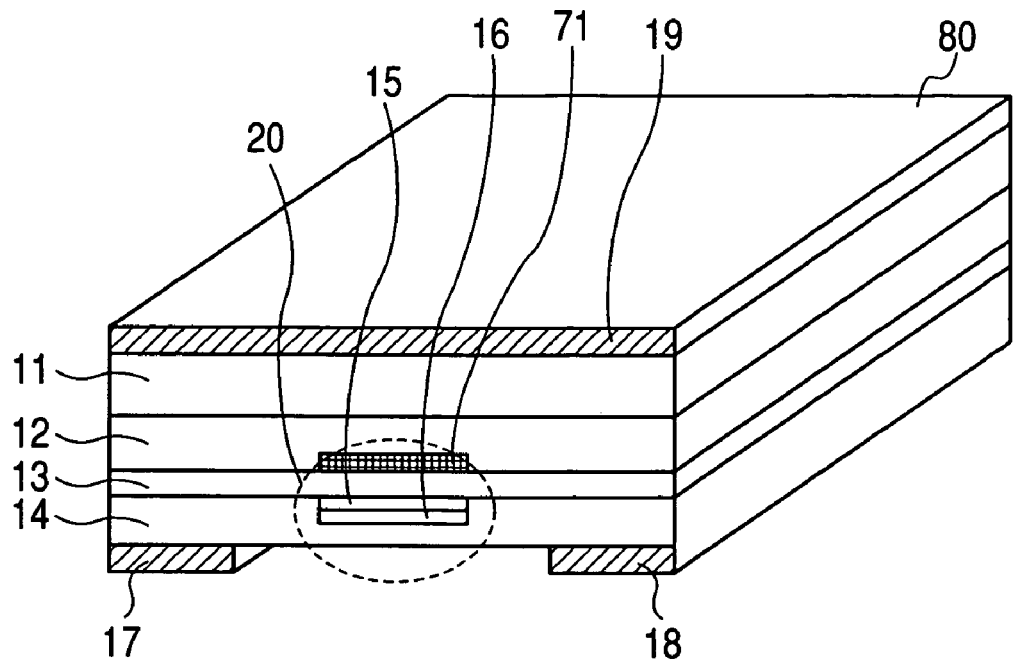
FIG. 3A shows a semiconductor laser shown in a third embodiment of the invention.

As shown in FIG. 3A, in a compound semiconductor member 80 using InP as a material, a diffraction grating 71 was at first formed to a portion of the n-type semiconductor layer 11 on an active layer. Then, the compound semiconductor member 80 is completed by way of the steps identical with those in the first embodiment.

Figure 3B:
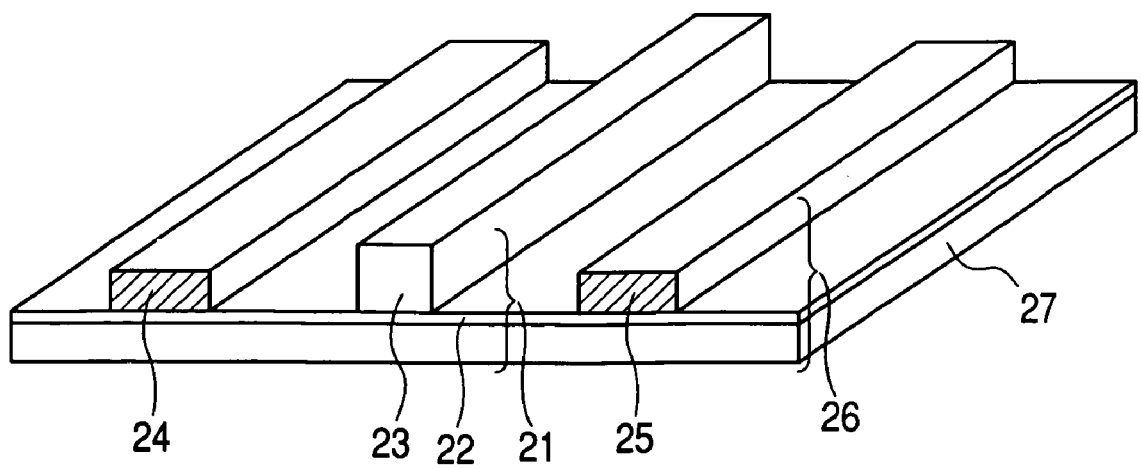
FIG. 3B shows a semiconductor laser shown in the third embodiment of the invention.

As shown in FIG. 3B, a silicon member 26 is completed by way of the steps identical with those in the first embodiment.

Figure 3C:
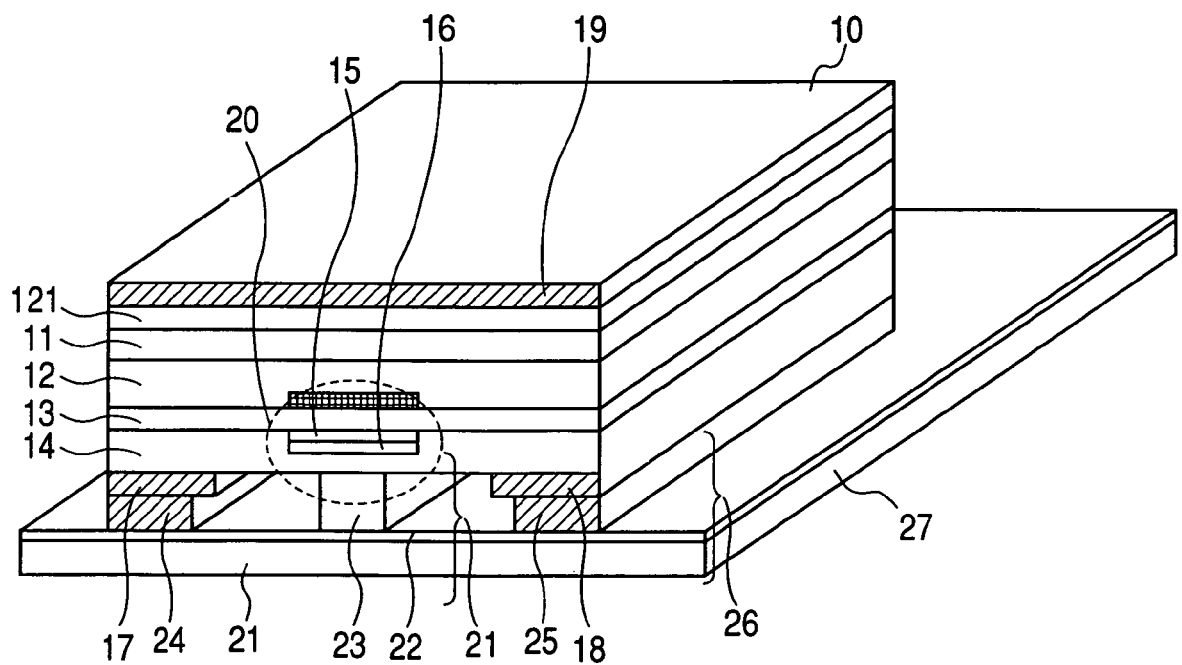
FIG. 3C shows a semiconductor laser shown in the third embodiment of the invention.

Then, as shown in FIG. 3C, a semiconductor laser apparatus is completed by the steps identical with those in the first embodiment.

Figure 3D:
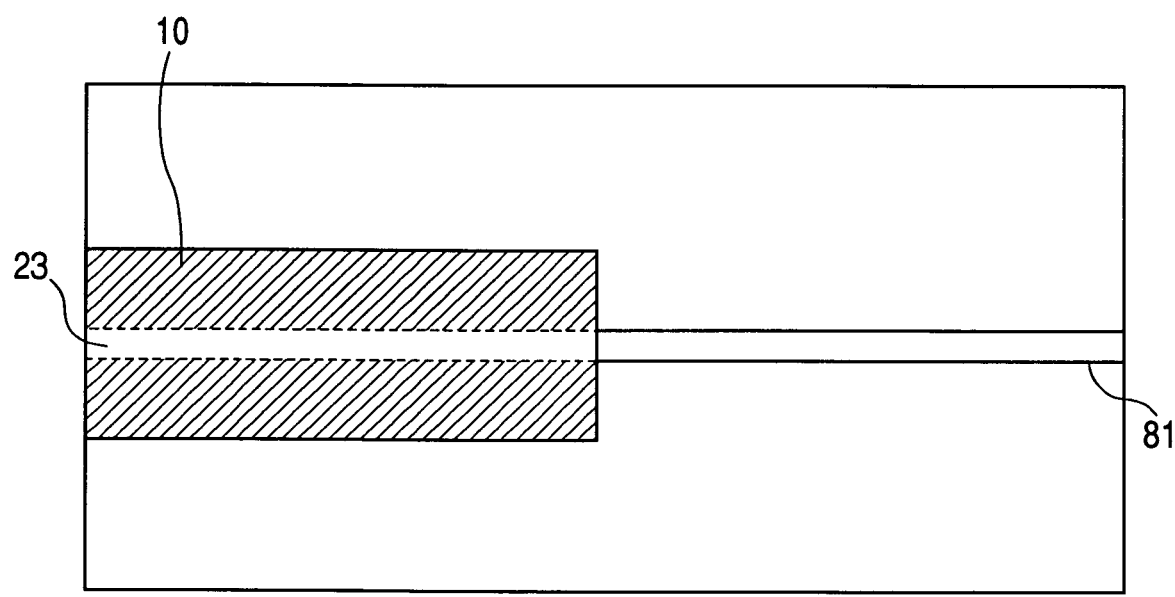
FIG. 3D shows a semiconductor laser shown in the third embodiment of the invention.

In this embodiment, since the diffraction grating is present, the end face reflection mirror is not necessary. Accordingly, as shown in FIG. 3D, it can be also constituted to connect a silicon waveguide 81 to the silicon waveguide 23.

The laser apparatus can conduct single mode oscillation at a threshold value of 20 mA by current injection.

Fourth Embodiment

FIG. 4 shows a fourth embodiment of the invention. In this embodiment, a distributed feedback type laser is formed by additionally forming a diffraction grating to the compound semiconductor member described in the second embodiment.

Figure 4A:
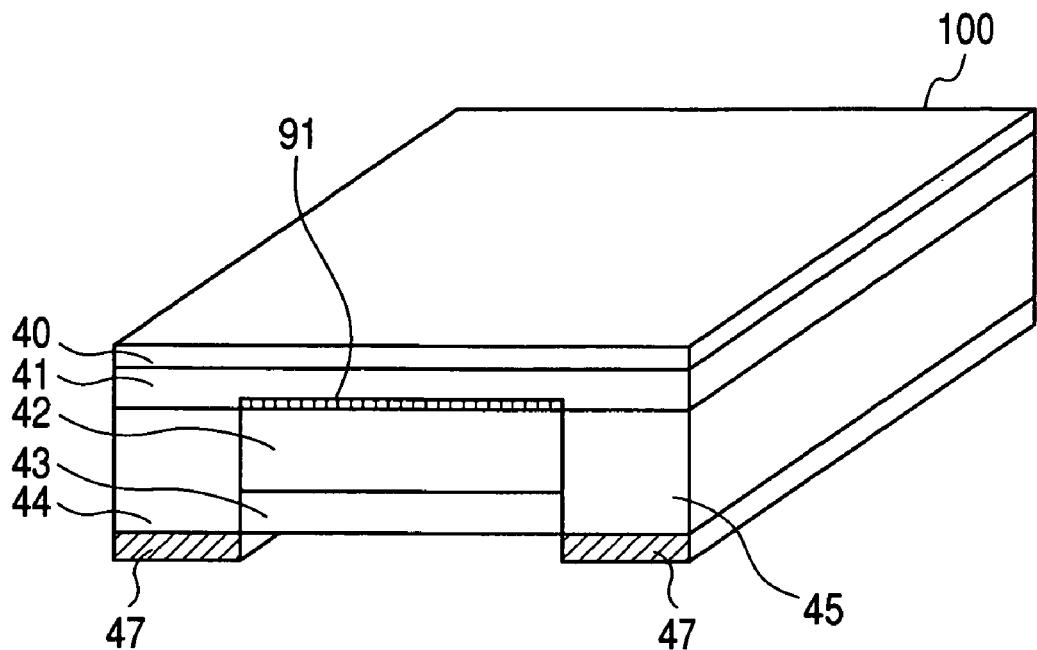
FIG. 4A shows a semiconductor laser shown in a fourth embodiment of the invention.

As shown in FIG. 4A, in a compound semiconductor member 100 made of InP as a material, a diffraction grating 91 is at first formed to a portion of an insulative semiconductor layer 41 on an active layer. Then, a compound semiconductor member 100 is completed by way of steps identical with those in the second embodiment.

Figure 4B:
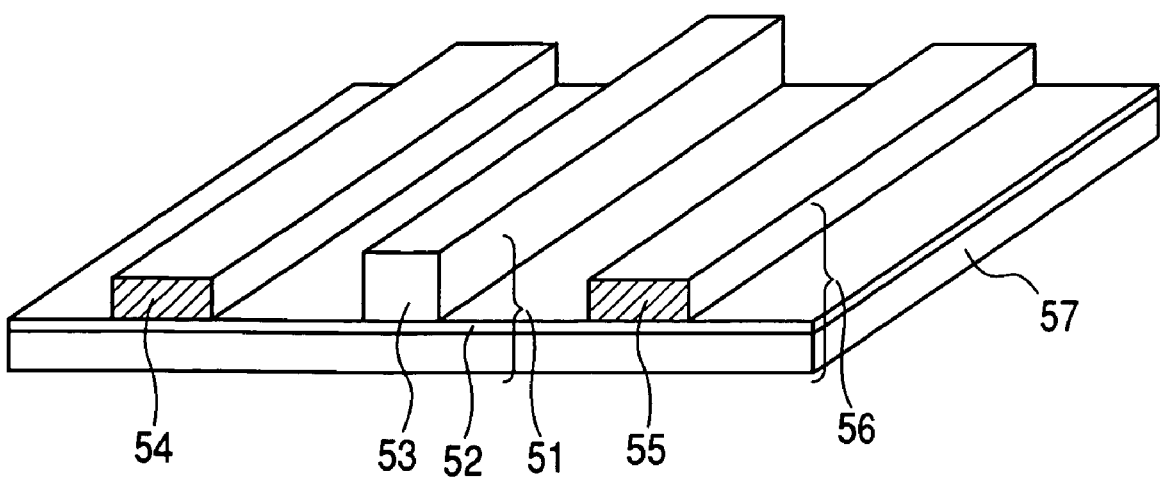
FIG. 4B shows a semiconductor laser shown in the fourth embodiment of the invention.

As shown in FIG. 4B, a silicon member 56 is completed by way of steps identical with those in the second embodiment.

Figure 4C:
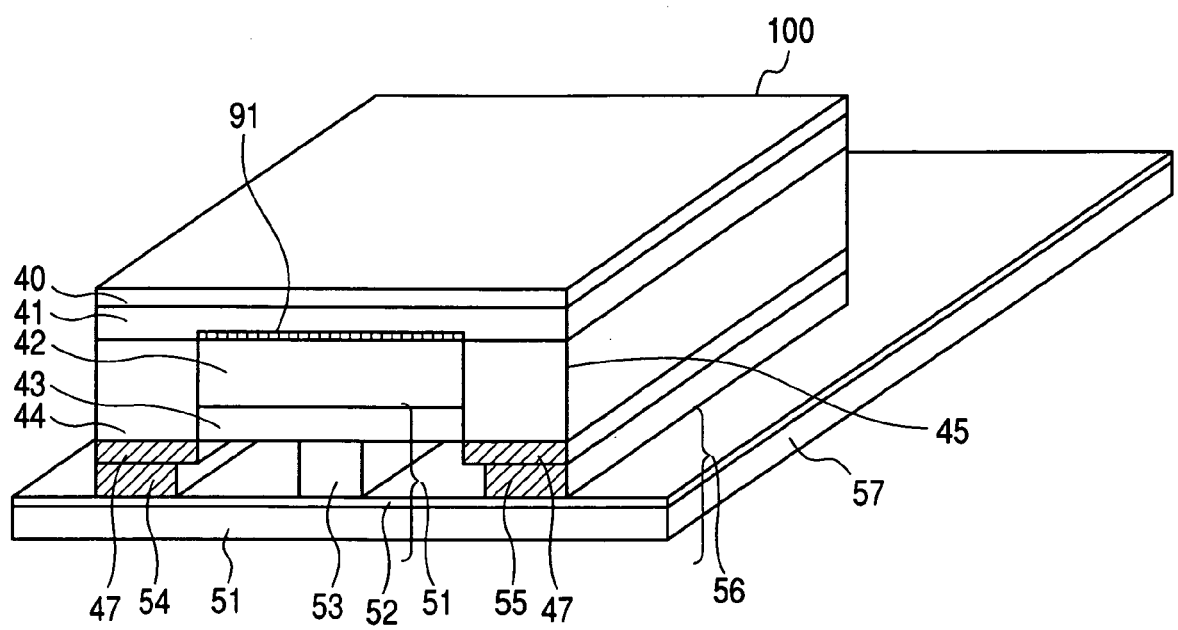
FIG. 4C shows a semiconductor laser shown in the fourth embodiment of the invention.

Then, as shown in FIG. 4C, a laser is completed by way of steps identical with that in the first embodiment.

Figure 4D:
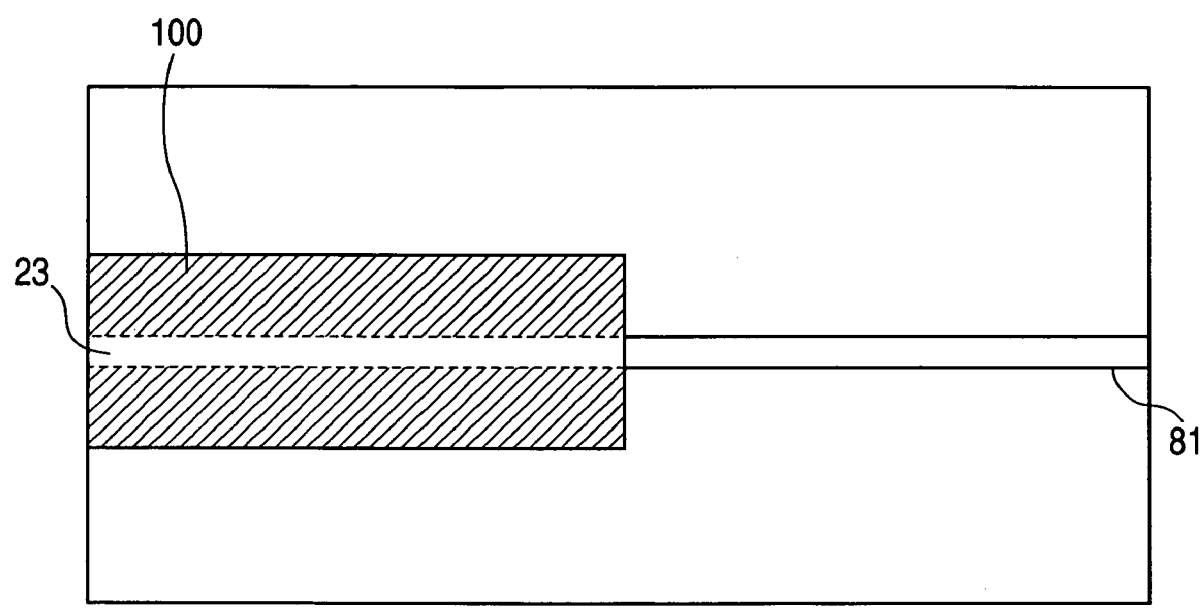
FIG. 4D shows a semiconductor laser shown in the fourth embodiment of the invention.

In this embodiment, since the diffraction grating is present, end face reflection mirrors are not necessary. Accordingly, as shown in FIG. 4D, it is also possible to constitute such that the silicon waveguide 91 is connected to the silicon waveguide 23.

The laser apparatus can conduct single mode oscillation at a threshold value of 20 mA by current injection.

Fifth Embodiment

Figure 5:
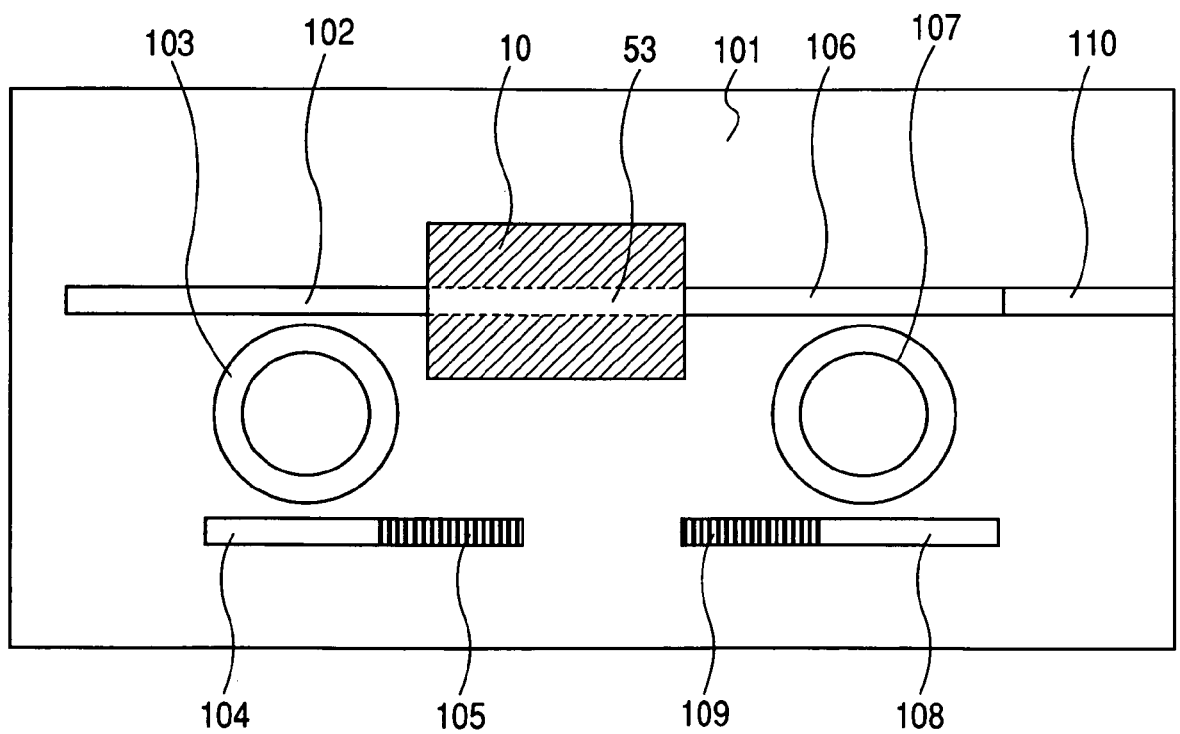
FIG. 5 is an upper plan view of a semiconductor laser shown by a fifth embodiment of the invention.

FIG. 5 shows a fifth embodiment of the invention. This is an example in which reflection mirrors are formed on both end faces of an optical guide channel of a silicon member 101.

The compound semiconductor member is identical with the compound semiconductor member 10 shown in the first embodiment, or the compound semiconductor member 50 shown in the second embodiment.

In the silicon member 101, a silicon layer on an SOI substrate is fabricated to form an optical waveguide as shown in FIG. 5. A silicon waveguide 102, a ring-shape resonator 103, a silicon waveguide 104, and a diffraction grating (also referred to as a conduction type reflection mirror here and hereinafter) 105 are optically connected on one side of the silicon waveguide 53. A silicon waveguide 106, a ring-shape resonator 107, a silicon waveguide 108, and a diffraction grating (also referred to as a conduction type reflection mirror here and hereinafter) 109 are optically connected on the other side of the silicon waveguide 53. Further, a silicon waveguide 110 for taking out the laser output is connected with a silicon waveguide 106.

Figure 6:
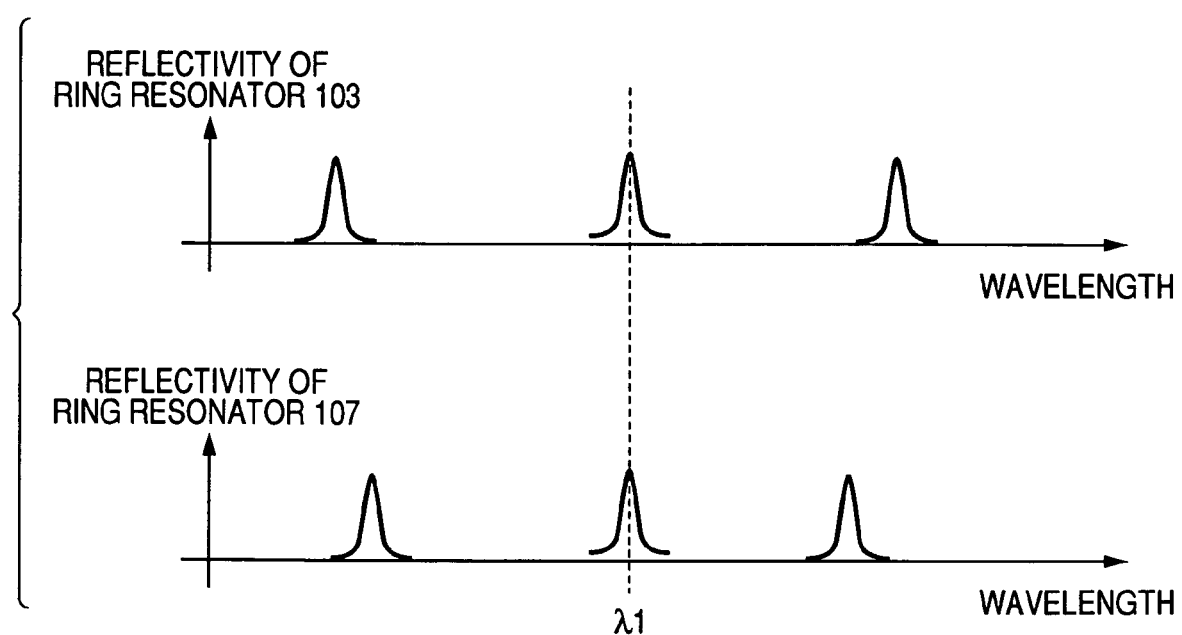
FIG. 6 is an explanatory view for the operation principle of a semiconductor laser shown in the fifth embodiment of the invention.

The operation principle is to be described with reference to FIG. 6. As shown in FIG. 6, the ring-shape resonator reflects only in a narrow wavelength region. The laser of this embodiment conducts single mode oscillation at a wavelength $\lambda_1$ where the reflectance each of the ring-shape resonator 103 and the reflection peak of the ring-shape resonator 107 are aligned.

This laser can conduct single mode oscillation at a threshold value of 20 mA by current injection.

While a compound semiconductor member 10 having the tunneling junction is used in this embodiment, a compound semiconductor member 250 having a lateral P-I-N junction may also be used.

The technical matters concerned with the invention are as described below.

An optical amplifier apparatus including;
  a compound semiconductor member in which
  a waveguide type semiconductor active layer is formed to a portion on a first insulating semiconductor layer disposed above a compound semiconductor substrate,
  a second insulating semiconductor layer for confining a current to the active layer is disposed on the active layer,
  the active layer and the second insulating semiconductor layer are overlapped and formed each in a stripe shape,
  a first waveguide type first contact layer is disposed on one side of a stack having the active layer and the second insulating semiconductor layer, and a second waveguide type second contact layer is disposed on the other side of the stack, and
  a first electrode is disposed on the first contact layer and a second electrode is disposed on the second contact layer,
  a first silicon optical waveguide in a stripe shape formed on an SOI (Silicon-On-Insulator) substrate in which silicon layer is disposed by way of a buried oxide layer above the silicon member, and
  a silicon member in which third and fourth electrodes are spaced from each other for supplying a current to the active layer being fixed to the first and the second electrodes respectively, in which
  the first electrode and the third electrode are fixed, the second electrode and the fourth electrode are fixed and, in a case where they are fixed, at least a portion of the first silicon optical waveguide and the second insulating semiconductor layer are in contact with each other.
2. An optical amplifier apparatus according to 1 described above which is formed as a distributed feedback type by providing a diffraction grating near the active layer.
3. An optical amplifier device according to 1 described above in which the first silicon optical waveguide in contact with the second insulating semiconductor layer and the second silicon optical waveguide are connected, and the second silicon optical waveguide is disposed on the silicon member.
4. An optical amplifier device according to 1 described above wherein the end of the first silicon optical waveguide and the end of the second silicon optical waveguide constitute first and second non-reflection mirrors respectively.

What is claimed is:
1. A semiconductor laser apparatus comprising:
  a compound semiconductor member; in which
  a first conduction type first clad layer, an active layer, and a second conduction type second clad layer are disposed in this order above a compound semiconductor substrate,
  a second conduction type first semiconductor layer doped with an impurity at a concentration higher than that of the second clad layer and a first conduction type second semiconductor layer are disposed to a portion on the second clad layer, the first semiconductor layer and the second semiconductor layer are overlapped and each in a stripe shape, a first conduction type third semiconductor layer doped at a concentration lower than that of the second semiconductor layer is disposed, the third semiconductor layer surrounds the first and the second semiconductor layers and is disposed on the second clad layer, the first and the second semiconductor layers confine the current, and the portion of the first to third semiconductor layers constitutes a tunneling junction structure, a first electrode is disposed on the compound semiconductor substrate on the side opposite to the first clad layer of the compound semiconductor substrate, and the second and third electrodes are disposed on the third semiconductor layer and at positions spaced from the portion of the tunneling junction structure, a silicon optical waveguide in a stripe shape formed on an SOI (Silicon-On-Insulator) substrate in which a silicon layer is disposed by way of a buried oxide layer above a silicon member, and a silicon member in which fourth and fifth electrodes are spaced apart from each other for supplying a current to the active layer while being fixed to the second and third electrodes respectively, in which the second electrode and the fourth electrode are fixed and the third electrode and the fifth electrode are fixed and, in a case where they are fixed, at least a portion of the silicon optical waveguide and the third semiconductor layer are in contact with each other.

2. The semiconductor laser apparatus according to claim 1, wherein the apparatus is formed as a distributed feedback type by the provision of a diffraction grating near the active layer.

3. The semiconductor laser apparatus according to claim 1, wherein
the silicon optical waveguide extends to both outsides of a portion where silicon optical waveguide and the third semiconductor layer are in contact respectively to form a first silicon optical waveguide and a second silicon optical waveguide,
a first ring-shape resonator is disposed near the first silicon optical waveguide and on the silicon member, a third silicon optical waveguide is disposed near the first ring-shape resonator and on the silicon member, and a first conduction type reflection mirror is disposed to a portion of the third silicon optical waveguide, and
a second ring-shape resonator is disposed near the second silicon optical waveguide and on the silicon member, a fourth optical waveguide is disposed near the second ring-shape resonator and on the silicon member, and a second conduction type reflection mirror is disposed to a portion of the fourth silicon optical waveguide.

4. The semiconductor laser apparatus according to claim 3, wherein single mode oscillation is conducted at a wavelength λ1 where the reflectance peaks of the first and the second ring-shape resonators are aligned.

5. The semiconductor laser apparatus according to claim 1, wherein the end of the silicon optical waveguide and the end of the third semiconductor layer constitute first and second reflection mirrors, respectively.

6. An optical amplifier apparatus comprising:
a compound semiconductor member; in which
a first conduction type first clad layer, an active layer, and a second conduction type second clad layer are disposed in this order above a compound semiconductor substrate, a second conduction type first semiconductor layer doped with an impurity at a concentration higher than that of the second clad layer and a first conduction type second semiconductor layer are disposed to a portion on the second clad layer, the first semiconductor layer and the second semiconductor layer are overlapped and each in a stripe shape, a first conduction type third semiconductor layer doped at a concentration lower than that of the second semiconductor layer is disposed, the third semiconductor layer surrounds the first and the second semiconductor layers and is disposed on the second clad layer, the first and the second semiconductor layers confine the current, and the portion of the first to third semiconductor layers constitutes a tunneling junction structure, a first electrode is disposed on the compound semiconductor substrate on the side opposite to the first clad layer of the compound semiconductor substrate, and the second and third electrodes are disposed on the third semiconductor layer and at positions spaced from the portion of the tunneling junction structure, a silicon optical waveguide in a stripe shape formed on an SOI (Silicon-On-Insulator) substrate in which a silicon layer is disposed by way of a buried oxide layer above a silicon member, and a silicon member in which fourth and fifth electrodes are spaced apart from each other for supplying a current to the active layer while being fixed to the second and third electrodes respectively, in which the second electrode and the fourth electrode are fixed and the third electrode and the fifth electrode are fixed and, in a case where they are fixed, at least a portion of the silicon optical waveguide and the third semiconductor layer are in contact with each other.

7. The optical amplifier apparatus according to claim 6, wherein, the apparatus is formed as a distributed feedback type by the provision of a diffraction grating near the active layer.

8. The optical amplifier apparatus according to claim 6, wherein,
the silicon optical waveguide extends to both outsides of a portion where silicon optical waveguide and the third semiconductor layer are in contact respectively to form a first silicon optical waveguide and a second silicon optical waveguide,
a first ring-shape resonator is disposed near the first silicon optical waveguide and on the silicon member, a third silicon optical waveguide is disposed near the first ring-shape resonator and on the silicon member, and a first conduction type reflection mirror is disposed to a portion of the third silicon optical waveguide, and
a second ring-shape resonator is disposed near the second silicon optical waveguide and on the silicon member, a fourth optical waveguide is disposed near the second ring-shape resonator and on the silicon member, and a second conduction type reflection mirror is disposed to a portion of the fourth silicon optical waveguide.

9. The optical amplifier apparatus according to claim 8, wherein, single mode oscillation is conducted at a wavelength λ1 where the reflectance peaks of the first and the second ring-shape resonators are aligned.

10. The optical amplifier apparatus according to claim 6, wherein the end of the silicon optical waveguide and the end of the third semiconductor layer constitute first and second non-reflection mirrors respectively.

* * * * *